(12) United States Patent
Spors

(10) Patent No.: US 10,612,811 B2
(45) Date of Patent: Apr. 7, 2020

(54) HOUSING FOR ELECTRONIC DEVICES INCLUDING AIR OUTLET WITH FLUID INGRESS MITIGATION

(71) Applicant: Johnson Controls Technology Company, Plymouth, MI (US)

(72) Inventor: Daniel J. Spors, West Bend, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 333 days.

(21) Appl. No.: 15/584,996

(22) Filed: May 2, 2017

(65) Prior Publication Data
US 2018/0058713 A1   Mar. 1, 2018

Related U.S. Application Data

(63) Continuation-in-part of application No. 15/247,888, filed on Aug. 25, 2016.

(51) Int. Cl.
| | | |
|---|---|---|
| G06F 1/16 | (2006.01) |
| H05K 5/00 | (2006.01) |
| H05K 7/00 | (2006.01) |
| F24F 11/89 | (2018.01) |
| F24F 11/30 | (2018.01) |
| H05K 5/02 | (2006.01) |
| F24F 110/10 | (2018.01) |

(52) U.S. Cl.
CPC .............. *F24F 11/89* (2018.01); *F24F 11/30* (2018.01); *H05K 5/0213* (2013.01); *F24F 2110/10* (2018.01)

(58) Field of Classification Search
CPC .. G06F 1/20; G06F 1/203; G06F 1/206; F24F 11/89; F24F 11/30; H05K 5/0213

USPC .............. 361/679.01, 679.47, 679.49, 679.5, 361/679.51
See application file for complete search history.

(56) References Cited

U.S. PATENT DOCUMENTS

| | | |
|---|---|---|
| 1,664,171 A | 3/1928 | Hicks |
| 1,871,008 A | 8/1932 | Rentz |
| 2,954,456 A | 9/1960 | Calhoun et al. |
| 3,050,866 A | 8/1962 | Macemon |
| 3,165,624 A | 1/1965 | Cunningham |
| 3,294,158 A | 12/1966 | Baljet |
| 3,359,965 A | 12/1967 | Milligan |
| 3,408,480 A | 10/1968 | Peltak et al. |

(Continued)

FOREIGN PATENT DOCUMENTS

| | | |
|---|---|---|
| CN | 302042137 | 8/2005 |
| CN | 3677789 | 8/2007 |

(Continued)

OTHER PUBLICATIONS

Extended Search Report for European Application No. 17186332.7, dated Jan. 30, 2018, 8 pages.

(Continued)

*Primary Examiner* — Anthony M Haughton
(74) *Attorney, Agent, or Firm* — Foley & Lardner LLP

(57) ABSTRACT

A housing for an electronic device includes a rear wall with an exterior surface, a top wall, a ledge with an exterior surface, and an air outlet formed between the top wall and the ledge. The ledge is positioned below the top wall. The exterior surface of the ledge is positioned at an exterior angle less than 90° relative to the exterior surface of the rear wall.

19 Claims, 14 Drawing Sheets

(56) References Cited

U.S. PATENT DOCUMENTS

| | | |
|---|---|---|
| 3,448,243 A | 6/1969 | Ripple |
| 3,488,475 A | 1/1970 | Gronwoldt |
| 3,543,003 A | 11/1970 | Dincher et al. |
| 3,588,774 A | 6/1971 | Caveney |
| 3,596,058 A | 7/1971 | Steiner |
| 3,627,984 A | 12/1971 | Bollinger |
| 3,737,624 A | 6/1973 | Eilenberger |
| 3,876,469 A | 4/1975 | Schimke |
| 4,273,990 A | 6/1981 | Steiner et al. |
| 4,311,898 A | 1/1982 | McMillan |
| 4,430,521 A | 2/1984 | Ofield et al. |
| 4,467,179 A | 8/1984 | Ali et al. |
| 4,761,537 A | 8/1988 | Hayes |
| 5,105,730 A | 4/1992 | Smith |
| D333,574 S | 3/1993 | Ackeret |
| 5,597,033 A | 1/1997 | Cali |
| 5,825,973 A | 10/1998 | Lehoe et al. |
| 5,884,690 A | 3/1999 | Zussman et al. |
| 5,963,708 A | 10/1999 | Wong |
| 6,085,985 A | 7/2000 | Laselva |
| 6,207,236 B1 | 3/2001 | Araki et al. |
| D518,744 S | 4/2006 | Rosen |
| D556,061 S | 11/2007 | Rosen |
| D560,686 S | 1/2008 | Kim |
| 7,405,930 B2 * | 7/2008 | Hongo ............... G06F 1/203 165/104.29 |
| D582,802 S | 12/2008 | Branson et al. |
| D592,982 S | 5/2009 | Burt et al. |
| D606,537 S | 12/2009 | Ferrari et al. |
| 7,789,129 B1 | 9/2010 | Barden |
| D637,992 S | 5/2011 | Tom et al. |
| D648,641 S | 11/2011 | Wallaert et al. |
| D648,642 S | 11/2011 | Wallaert et al. |
| D652,034 S | 1/2012 | Ferrari et al. |
| 8,149,222 B2 | 4/2012 | Hsieh et al. |
| D666,198 S | 8/2012 | Van Den Nieuwenhuizen et al. |
| D666,510 S | 9/2012 | Beland et al. |
| D672,666 S | 12/2012 | Rhodes et al. |
| D673,467 S | 1/2013 | Lee et al. |
| D675,204 S | 1/2013 | Hofer et al. |
| D676,768 S | 2/2013 | Eyring et al. |
| D676,769 S | 2/2013 | Eyring et al. |
| D677,660 S | 3/2013 | Groene et al. |
| D678,084 S | 3/2013 | Beland et al. |
| D679,205 S | 4/2013 | Eyring et al. |
| D684,872 S | 6/2013 | Bias et al. |
| D687,388 S | 8/2013 | Baumgartner et al. |
| D688,955 S | 9/2013 | Deligiannis et al. |
| D694,195 S | 11/2013 | Gammon et al. |
| D694,718 S | 12/2013 | Baumgartner et al. |
| D699,130 S | 2/2014 | Rhodes et al. |
| D705,094 S | 5/2014 | Eyring et al. |
| D708,977 S | 7/2014 | Corso et al. |
| D715,165 S | 10/2014 | Deligiannis et al. |
| D715,166 S | 10/2014 | Rhodes |
| D717,673 S | 11/2014 | Eyring et al. |
| D727,180 S | 4/2015 | Lai et al. |
| D729,793 S | 5/2015 | Hickok et al. |
| D733,591 S | 7/2015 | Golden et al. |
| D734,179 S | 7/2015 | Golden et al. |
| D737,155 S | 8/2015 | Gmyr et al. |
| D738,232 S | 9/2015 | Eyring et al. |
| D738,755 S | 9/2015 | Druce |
| D738,756 S | 9/2015 | Jiang et al. |
| D743,349 S | 11/2015 | Leeland et al. |
| D744,433 S | 12/2015 | Baumgartner et al. |
| D748,082 S | 1/2016 | Lee et al. |
| D751,426 S | 3/2016 | Edgar |
| D752,568 S | 3/2016 | Kang et al. |
| 9,282,656 B2 * | 3/2016 | Degner ............... H05K 5/02 |
| D753,106 S | 4/2016 | Chao |
| D758,217 S | 6/2016 | Kumfer et al. |
| 9,400,526 B2 * | 7/2016 | Casebolt ............... G06F 1/1656 |
| D763,707 S | 8/2016 | Sinha et al. |
| D769,231 S | 10/2016 | Kwak et al. |
| D770,449 S | 11/2016 | Bae et al. |
| D772,735 S | 11/2016 | Mansueto et al. |
| D778,245 S | 2/2017 | Feldstein et al. |
| D787,465 S | 5/2017 | Levi et al. |
| D796,352 S | 9/2017 | Morneau et al. |
| D801,288 S | 10/2017 | Kim et al. |
| D812,048 S | 3/2018 | Mazz et al. |
| 9,976,774 B1 | 5/2018 | Markow |
| D828,816 S | 9/2018 | Spors et al. |
| 2001/0020646 A1 | 9/2001 | Hebert |
| 2006/0182429 A1 | 8/2006 | Shapiro et al. |
| 2008/0029613 A1 | 2/2008 | Friedlich |
| 2008/0178567 A1 | 7/2008 | Varrichio et al. |
| 2009/0085713 A1 | 4/2009 | Tsang |
| 2011/0011560 A1 | 1/2011 | Bono |
| 2012/0055651 A1 | 3/2012 | Coe et al. |
| 2012/0298330 A1 | 11/2012 | Mysse |
| 2013/0161489 A1 | 6/2013 | Gardner, Jr. |
| 2013/0279142 A1 | 10/2013 | Wang |
| 2014/0043256 A1 | 2/2014 | Wu et al. |
| 2014/0273616 A1 | 9/2014 | Eichert |
| 2014/0300567 A1 | 10/2014 | Inata et al. |
| 2015/0021064 A1 | 1/2015 | Wang et al. |
| 2015/0062087 A1 | 3/2015 | Cho et al. |
| 2016/0273785 A1 | 9/2016 | Marino et al. |
| 2016/0324026 A1 | 11/2016 | Kang et al. |
| 2017/0097193 A1 | 4/2017 | Stanley et al. |
| 2018/0058713 A1 | 3/2018 | Spors |
| 2018/0058941 A1 | 3/2018 | Spors |

FOREIGN PATENT DOCUMENTS

| | | |
|---|---|---|
| CN | 300763793 | 4/2008 |
| CN | 301076701 | 12/2009 |
| CN | 301262175 | 6/2010 |
| CN | 301318189 | 8/2010 |
| CN | 301318218 | 8/2010 |
| CN | 301318220 | 8/2010 |
| CN | 301367662 | 10/2010 |
| CN | 301379502 | 11/2010 |
| CN | 301425146 | 12/2010 |
| CN | 301437651 | 1/2011 |
| CN | 301596683 | 6/2011 |
| CN | 301640279 | 8/2011 |
| CN | 301671557 | 9/2011 |
| CN | 301900552 | 5/2012 |
| CN | 301936315 | 5/2012 |
| CN | 301936316 | 5/2012 |
| CN | 301936441 | 5/2012 |
| CN | 301966054 | 6/2012 |
| CN | 301966088 | 6/2012 |
| CN | 302009181 | 7/2012 |
| CN | 302009186 | 7/2012 |
| CN | 302042060 | 8/2012 |
| CN | 302042135 | 8/2012 |
| CN | 302062604 | 9/2012 |
| CN | 302244026 | 12/2012 |
| CN | 302269957 | 1/2013 |
| CN | 302313577 | 2/2013 |
| CN | 302360122 | 3/2013 |
| CN | 302503612 | 7/2013 |
| CN | 302517156 | 7/2013 |
| CN | 302908442 | 8/2014 |
| CN | 302908443 | 8/2014 |
| CN | 303030615 | 12/2014 |
| CN | 301936456 | 5/2015 |
| CN | 303238413 | 6/2015 |
| CN | 303246894 | 6/2015 |
| CN | 303255433 | 6/2015 |
| CN | 303255434 | 6/2015 |
| CN | 303337349 | 8/2015 |
| CN | 303375958 | 9/2015 |
| CN | 303385632 | 9/2015 |
| CN | 303394163 | 9/2015 |
| CN | 303451296 | 11/2015 |
| CN | 303603907 | 3/2016 |
| CN | 303653904 | 4/2016 |
| CN | 303709538 | 6/2016 |
| CN | 303717815 | 6/2016 |

(56) References Cited

FOREIGN PATENT DOCUMENTS

| | | |
|---|---|---|
| CN | 303717816 | 6/2016 |
| CN | 303717817 | 6/2016 |
| CN | 303717819 | 6/2016 |
| CN | 303717823 | 6/2016 |
| CN | 303726743 | 6/2016 |
| CN | 303726744 | 6/2016 |
| CN | 303737244 | 7/2016 |
| CN | 303737245 | 7/2016 |
| CN | 303789869 | 8/2016 |
| CN | 303814825 | 8/2016 |
| EM | 941031-001 | 2/1994 |
| EM | 946447-001 | 11/1994 |
| EM | 946448-001 | 11/1994 |
| EM | 000907720-0001 | 4/2008 |
| EM | 001944638-0001 | 11/2011 |
| EM | 002016436-0001 | 3/2012 |
| EM | 001345771-0031 | 9/2012 |
| EM | 002103713-0001 | 9/2012 |
| EM | 002165068-0001 | 1/2013 |
| EM | 002221440-0004 | 4/2013 |
| EM | 002297606-0001 | 8/2013 |
| EM | 002299909-0002 | 8/2013 |
| EM | 002379198-0001 | 12/2013 |
| EM | 002418830-0040 | 3/2014 |
| EM | 002433060-0005 | 3/2014 |
| EM | 002476010-0001 | 6/2014 |
| EM | 002526251-0003 | 8/2014 |
| EM | 002609768-0001 | 1/2015 |
| EM | 002763698-0016 | 9/2015 |
| EM | 002767970-0003 | 9/2015 |
| EM | 002842880-0004 | 10/2015 |
| EM | 003074640-0003 | 4/2016 |
| EM | 003339936-0001 | 8/2016 |
| IN | 239736-0001 | 9/2011 |
| JP | D1527751 | 5/2015 |
| KR | 300513953.0000 | 12/2008 |
| KR | 300559936.0000 | 4/2010 |
| KR | 300559937.0000 | 4/2010 |
| KR | 300563103.0000 | 5/2010 |
| KR | 300563104.0000 | 5/2010 |
| KR | 300597072.0000 | 4/2011 |
| KR | 300597075.0000 | 4/2011 |
| KR | 300597078.0000 | 4/2011 |
| KR | 300597085.0000 | 4/2011 |
| KR | 300597095.0000 | 4/2011 |
| KR | 300597103.0000 | 4/2011 |
| KR | 300597104.0000 | 4/2011 |
| KR | 300597105.0000 | 4/2011 |
| KR | 300597106.0000 | 4/2011 |
| KR | 300597109.0000 | 4/2011 |
| KR | 300743169.0000 | 5/2014 |
| KR | 300788997.0000 | 3/2015 |
| KR | 300803551.0000 | 6/2015 |
| KR | 300810461.0000 | 8/2015 |
| WO | WO-D075763-002 | 3/2011 |
| WO | WO-D088823-003 | 11/2015 |
| WO | WO-2018/156137 A1 | 8/2018 |

OTHER PUBLICATIONS

Notice of Allowance for U.S. Appl. No. 29/602,691, dated Apr. 18, 2018, 8 pages.

* cited by examiner

SECTION A-A

SECTION B-B

SECTION C-C

SECTION C-C

HOUSING FOR ELECTRONIC DEVICES INCLUDING AIR OUTLET WITH FLUID INGRESS MITIGATION

CROSS REFERENCE TO RELATED APPLICATION

The present application is a continuation-in-part of U.S. patent application Ser. No. 15/247,888, filed Aug. 25, 2016, which is incorporated herein by reference.

BACKGROUND

The present application relates generally to the fields of electronic HVAC devices and accessories for electronic HVAC devices. The present application relates more specifically to a cover that may be installed on an electronic device to protect the device against fluid ingress and to a housing of an electronic device configured to protect the device against fluid ingress.

As electronic HVAC equipment becomes smaller, faster, and more feature-laden, it consumes more power and generates more heat. Heat can be detrimental to the performance, reliability, and useful life of electronic equipment, therefore it must be carefully managed. Often, heat is managed wholly or partially via convection airflow that necessitates the use of vent openings in the device enclosure. At the same time, these devices are often installed in environments where they must be regularly cleaned with a fluid solution. Fluid that enters the device via the vent openings may cause electrical short-circuits or corrosion, significantly degrading the useful life of the device. Accordingly, there is a need for a cover for an electronic device that both permits convection airflow and prevents fluid ingress, and there is a need for a housing for an electronic device that both permits convection airflow and prevents fluid ingress.

SUMMARY

Referring generally to the FIGURES, a fluid protection cover for an electronic device and an electronic device including a fluid protection housing are shown, according to exemplary embodiments. The fluid protection cover and housing described herein may be used with an electronic device (e.g., a thermostat or a sensor) in an HVAC system, building management system (BMS), or any other system configured to control the environmental conditions of a building. In some instances, these electronic devices are installed in buildings in which all surfaces that are routinely touched by occupants must be routinely sanitized or cleaned with a liquid cleaning solution to control the spread of germs and bacteria. Examples of these types of buildings might include, but are not limited to, a hospital, a research facility, a hotel, or a school.

For a variety of reasons, the electronic devices installed in these buildings often cannot be completely sealed against fluid ingress. For example, electronic devices often include cooling features designed to ensure that components mounted on circuit cards within the devices do not overheat. One common cooling technique is the use of vent openings to permit convection air currents to draw heat from the electronics and out of a device enclosure. Although these vent openings may be located on the bottom or sides of the enclosure, they are most effective at cooling the device when located both on the top and bottom of the enclosure. In other instances, one of the functions of the electronic device may be to sample a condition of air, thus requiring a means for air to enter the device and preventing the device from including protective seals. Locating openings at the top of a device enclosure for cooling or sampling purposes permits cleaning solution to enter the device when the cleaning solution is sprayed at or wiped across the device. This fluid ingress may result in device malfunction through several failure modes, including short-circuiting or corrosion of components. In some instances, these failures are sufficiently severe that they necessitate replacement of the electronic device. In other instances, the failures degrade the performance and reliability of the device.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

Referring generally to the FIGURES, a fluid protection cover and housing for an electronic device is shown, according to exemplary embodiments. The fluid protection cover and fluid protection housing described herein may be used with an electronic device (e.g., a thermostat or a sensor) in an HVAC system, building management system (BMS), or any other system configured to control the environmental conditions of a building. In some embodiments, the electronic device is a building automation device. Building automation devices include, but are not limited to, thermostats, sensors, lighting controls, building controls, and heating, ventilation, air-conditioning, and refrigeration equipment controls.

In some instances, these electronic devices are installed in buildings in which all surfaces that are routinely touched by occupants must be routinely sanitized or cleaned with a liquid cleaning solution to control the spread of germs and bacteria. Examples of these types of buildings might include, but are not limited to, a hospital, a research facility, a hotel, or a school.

For a variety of reasons, the electronic devices installed in these buildings often cannot be completely sealed against fluid ingress. For example, electronic devices often include cooling features designed to ensure that components mounted on circuit cards within the devices do not overheat. One common cooling technique is the use of vent openings to permit convection air currents to draw heat from the electronics and out of a device enclosure. Although these vent openings may be located on the bottom or sides of the enclosure, they are most effective at cooling the device when located both on the top and bottom of the enclosure. In other instances, one of the functions of the electronic device may be to sample a condition of air, thus requiring a means for air to enter the device and preventing the device from including protective seals. Locating openings at the top of a device enclosure for cooling or sampling purposes permits cleaning solution to enter the device when the cleaning solution is sprayed at or wiped across the device. This fluid ingress may result in device malfunction through several failure modes, including short-circuiting or corrosion of components. In some instances, these failures are sufficiently severe that they necessitate replacement of the electronic device. In other instances, the failures degrade the performance and reliability of the device.

Figure 1:
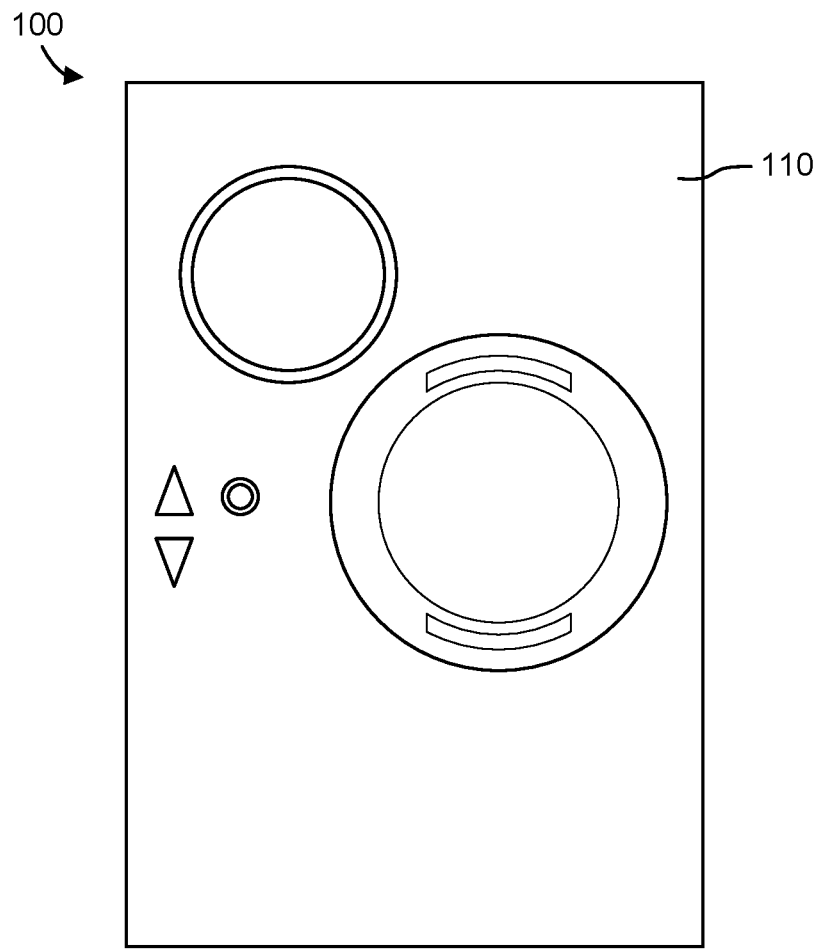
FIG. 1 is front elevation view schematic drawing of an electronic device vulnerable to fluid ingress, according to an example embodiment.

Referring to FIG. 1, a front view schematic drawing of electronic device 100 is depicted, according to an example embodiment. As described above, in some embodiments, electronic device 100 is an electronic thermostat, a sensor, or a building automation device configured for use in a building environmental management system; however, electronic device 100 may be any type of electronic device designed for convection cooling and susceptible to damage from fluid ingress. In some embodiments, electronic device 100 may be a wall-mounted sensor from the NS-7000 network sensor product series or the WRZ wireless room sensor product series, both of which are manufactured by Johnson Controls, Inc.

Electronic device 100 includes an electronic device enclosure 110. Electronic device enclosure 110 is configured to encapsulate the components of device 100. In some embodiments, these components may include one or more circuit card assemblies, control devices (e.g., actuators, buttons, etc.), and display screens. As described above, for various reasons, these components may not include prophylactic features against fluid ingress and may fail in a variety of modes after coming into contact with fluid (e.g., cleaning solution, water). For example, circuit card assemblies that do not have an applied conformal coat material may corrode in the presence of moisture.

Figure 2:
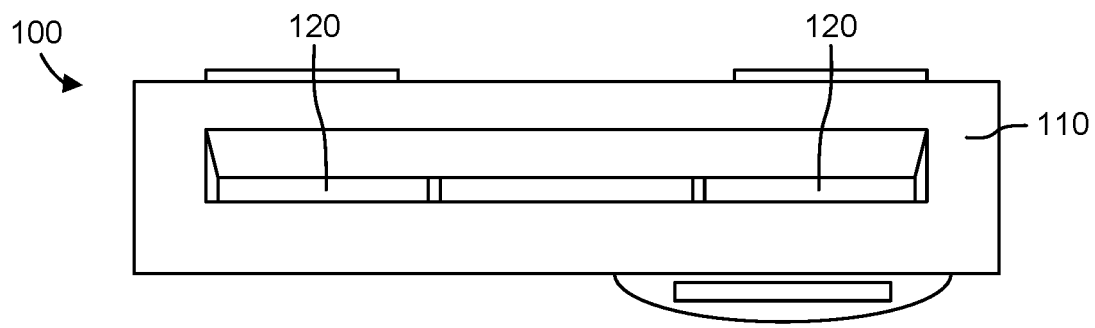
FIG. 2 is a top elevation view schematic drawing of the electronic device of FIG. 1, according to an example embodiment.

Referring now to FIG. 2, a top view schematic drawing of electronic device 100 is depicted, according to an example embodiment. Electronic device 100 includes a plurality of vent openings 120 on the top face of electronic device enclosure 110. The plurality of vent openings 120 may be any size or shape required to permit the convection airflow necessary to adequately cool device 100. In some embodiments, electronic device 100 may include additional vent openings on the sides, bottom, or front faces of electronic device enclosure 110. However, the vent openings 120 on the top face of electronic device enclosure 110 pose the greatest risk of damage due to fluid ingress. Fluid that enters device 100 via vent openings 120 on the top face of electronic device enclosure 110 will naturally flow down over the electronic components encapsulated by enclosure 110. Conversely, fluid that enters device 100 via vent openings 120 on the side faces of enclosure 110 will naturally flow down the inner faces of enclosure 110.

Figure 3:
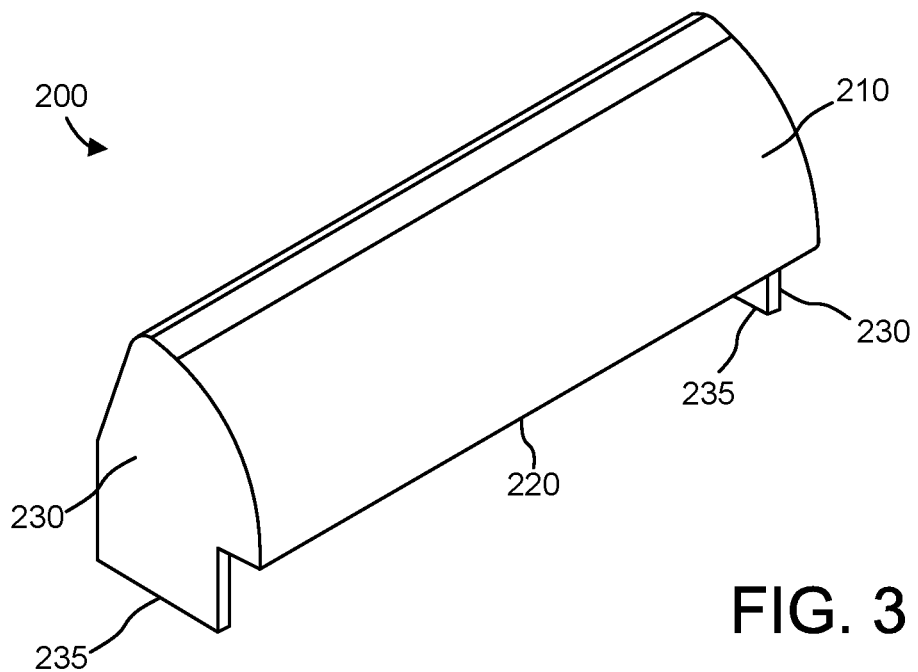
FIG. 3 is a perspective view schematic drawing of a fluid protection cover for an electronic device, according to an example embodiment.

Referring now to FIG. 3, a fluid protection cover 200 for an electronic device is depicted in a schematic drawing, according to an example embodiment. Fluid protection cover 200 is configured to shield the top face of electronic device enclosure 110, as described in FIGS. 1-2 in some embodiments. In some embodiments, fluid protection cover 200 is a separate component from electronic device 100, permitting cover 200 to be installed on or removed from electronic device 100 as desired. In other embodiments, the protective features of cover 200 is integrated into the design of device enclosure 110, preventing any disassembly of device 100 and cover 200.

Fluid protection cover 200 includes a cowl 210. Cowl 210 features curved geometry and terminates at bottom edge 220. The curved geometry of cowl 210 may be advantageous over a design with sharp or flared edges for several reasons in some embodiments. One reason is that a sharp edge is a geometric discontinuity that draws more fluid droplets to form from a fluid applicator (e.g., a rag, a sponge) than a curved face in some embodiments. Another reason is that a curved face provides a controlled path for droplets that do transfer from the fluid applicator to cowl 210 to travel away from any fluid-sensitive components in some embodiments.

Still referring to FIG. 3, fluid protection cover 200 terminates lengthwise at either end with end cap 230. The length of cover 200 may correspond with the length of electronic device 100 such that the interior faces of end caps 230 are either flush or substantially flush with the side faces of electronic device enclosure 110. In some embodiments, the bottom edges 235 of end caps 230 do not intersect with cowl bottom edge 220. This geometry permits end caps 230 to extend down the sides of electronic device enclosure 110 and provide a means to attach cover 200 to device 100 without cowl 210 obscuring the front face of device 100.

Obscuring the front face of device 100 may be particularly undesirable because the front face often contains the device user interface (e.g., status display screens, control buttons) needed to operate the device.

Figure 4:
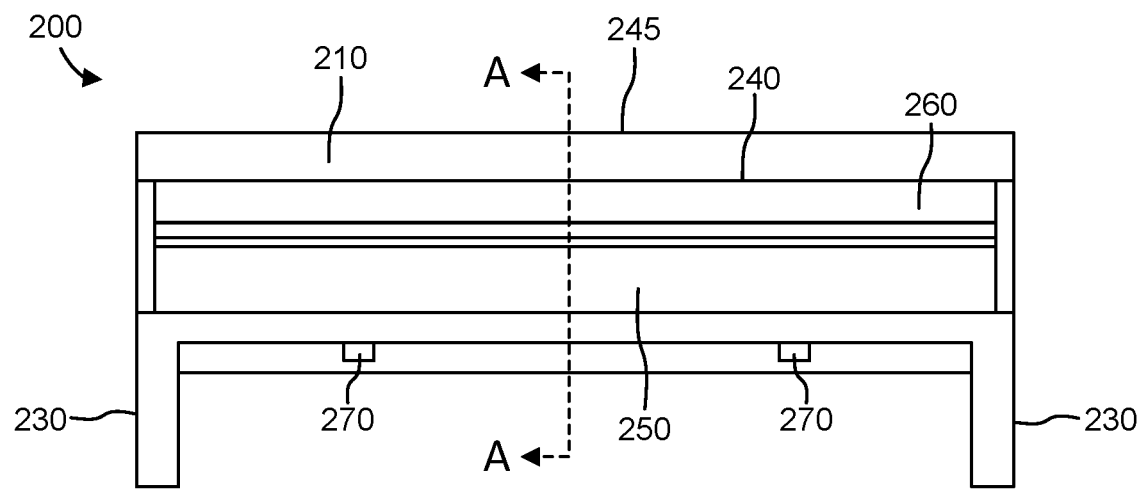
FIG. 4 is a rear elevation view schematic drawing of the fluid protection cover of FIG. 3, according to an example embodiment.
Figure 5:
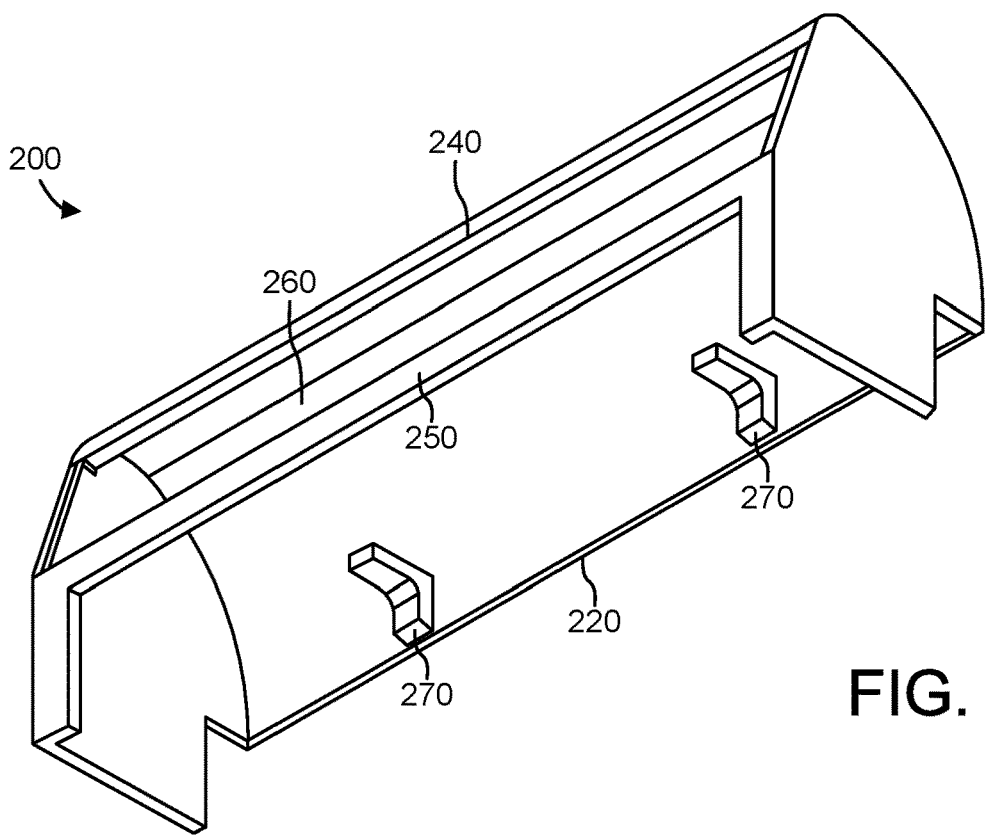
FIG. 5 is another perspective view schematic drawing of the fluid protection cover of FIG. 3, according to an example embodiment.

Turning now to FIGS. 4 and 5, additional views of fluid protection cover 200 are depicted in schematic drawings, according to an example embodiment. FIG. 4 depicts an elevation view of the opening 260 of fluid protection cover 200, while FIG. 5 depicts a perspective view of the opening 260. When installed on electronic device 100 (as depicted below in FIGS. 7-8), cover opening 260 may be located facing the surface on which device 100 is installed (e.g., the wall). Cowl bottom edge 220 may be located on the opposite side, near the front face of device 100.

Still referring to FIGS. 4 and 5, cover 200 is further shown to include cowl top edge 240 and primary louver 250. As depicted, cowl top edge 240 is not located coincident with cowl top surface 245. Instead, cowl 210 terminates at cowl top edge 240. Cowl top edge 240 is located below cowl top surface 245 to permit cowl top edge 240 to function as a "drip edge" that directs fluid to drip onto primary louver 250. In addition, cowl top edge 240 is located some distance below cowl top surface 245 such that cowl 210 covers a portion of the top of opening 260. This configuration is desirable because it ensures that cowl top surface 245 comprises the topmost surface of cover 200 and is the first point of cover 200 that comes into contact with any fluid transferred from a fluid applicator. Because cowl top surface 245 does not comprise a sharp edge, it minimizes the amount of cleaning fluid extracted from the fluid applicator.

Fluid that does collect along cowl top surface 245 travels substantially in one of two paths in some embodiments. The first path is toward cowl bottom edge 220. When the fluid reaches bottom edge 220, it forms droplets that may drip harmlessly down the front face of device enclosure 110. Because the front face of device enclosure 110 is unlikely to contain vent openings, there is a low risk that fluid traveling across the front face will encounter any path to enter device 100. The second path the fluid may travel after transferring to cowl top surface 245 is toward cowl top edge 240. Fluid that travels along the second path forms droplets when it reaches cowl top edge 240. These droplets may drip from cowl top edge 240 onto primary louver 250. Primary louver 250 is configured to include an inclined surface and a lip extending into opening 260. The lip prevents fluid that drips from cowl top edge 240 to the inclined surface from splashing into opening 260 and entering device 100. The inclined surface provides a controlled path for the fluid to travel down and away from opening 260, until it reaches and can drip harmlessly down the back face of device enclosure 110. End caps 230 are configured to join primary louver 250 to cowl 210.

Fluid protection cover 200 is further shown to include a plurality of resting points 270 located within opening 260. Resting points 270 are configured to position fluid protection cover 200 on electronic device 100 by resting on the top surface of device enclosure 110 when cover 200 is installed. Although depicted in FIGS. 4 and 5 as substantially L-shaped and protruding from cowl bottom edge 220, resting points 270 may be any desired shape that retains fluid protection cover 200 in the correct position on device 100.

Figure 6:
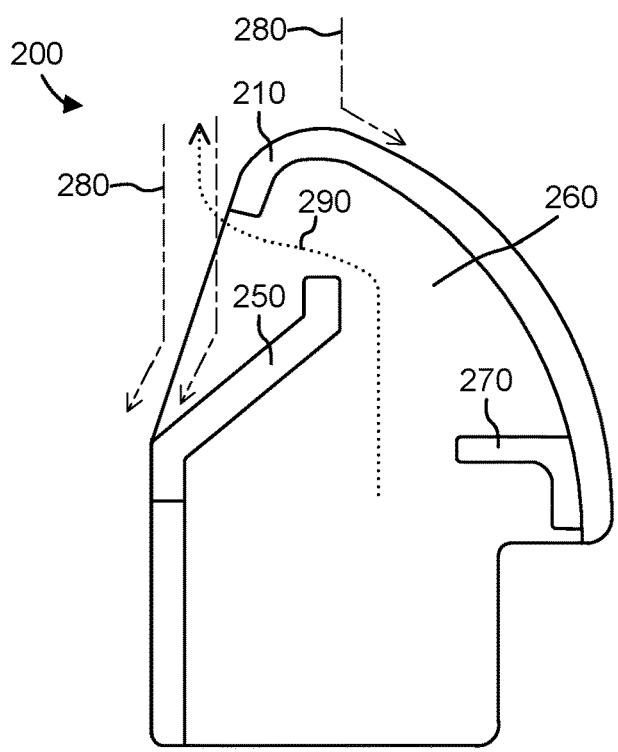
FIG. 6 is a cross-sectional view schematic drawing of the fluid protection cover of FIG. 3 taken along the line labeled "A-A" in FIG. 4, according to an example embodiment.

Turning now to FIG. 6, a side cross-sectional view schematic drawing of fluid protection cover 200 taken along the line labeled "A-A" in FIG. 4 is shown, according to an example embodiment. FIG. 6 depicts exemplary paths of fluid 280 and convection air 290 when cover 200 is installed on device 100. As shown, the features of cover 200 redirect the natural path of fluid 280 either along cowl 210 or primary louver 250 such that fluid is largely prevented from entering opening 260. Convection air 290 originating from vent openings 120 on the top of device 100 may travel upward and outward between cowl 210 and primary louver 250 until it reaches the ambient air.

As described above and depicted in FIG. 6, cowl 210 has an overall curved geometry. The geometry of cowl 210 largely defines the geometry of opening 260. This geometry may be optimized to meet the heat transfer needs of electronic device 100. For example, if opening 260 is too small, the free flow of convection air 290 may be choked, resulting in inadequate heat transfer and overheating of device 100. Conversely, if opening 260 is too large, the risk of fluid ingress may be increased without any corresponding benefit in increased heat transfer from device 100.

Referring now to FIGS. 3-6, fluid protection cover 200 may be formed or constructed from a variety of materials and in a variety of manners. For example, cover 200 may be of unitary construction (i.e., all one piece), where cover 200 may be molded, extruded, cast, formed/machined etc. In an exemplary embodiment, cover 200 may be injection molded as a single component. In another embodiment, cover 200 may be fabricated as separate components. As such, the separate components may be joined by any suitable manner (e.g., a bonding agent, a fastener such as a set screw, a combination thereof, etc.) to form a stacked structure. In addition, cover 200 may be constructed from any suitable material, including, but not limited to, plastic, composites, metal, metal alloys, and/or any combination thereof. In some embodiments, cover 200 may be fabricated from the same material as electronic device enclosure 110.

Figure 7:
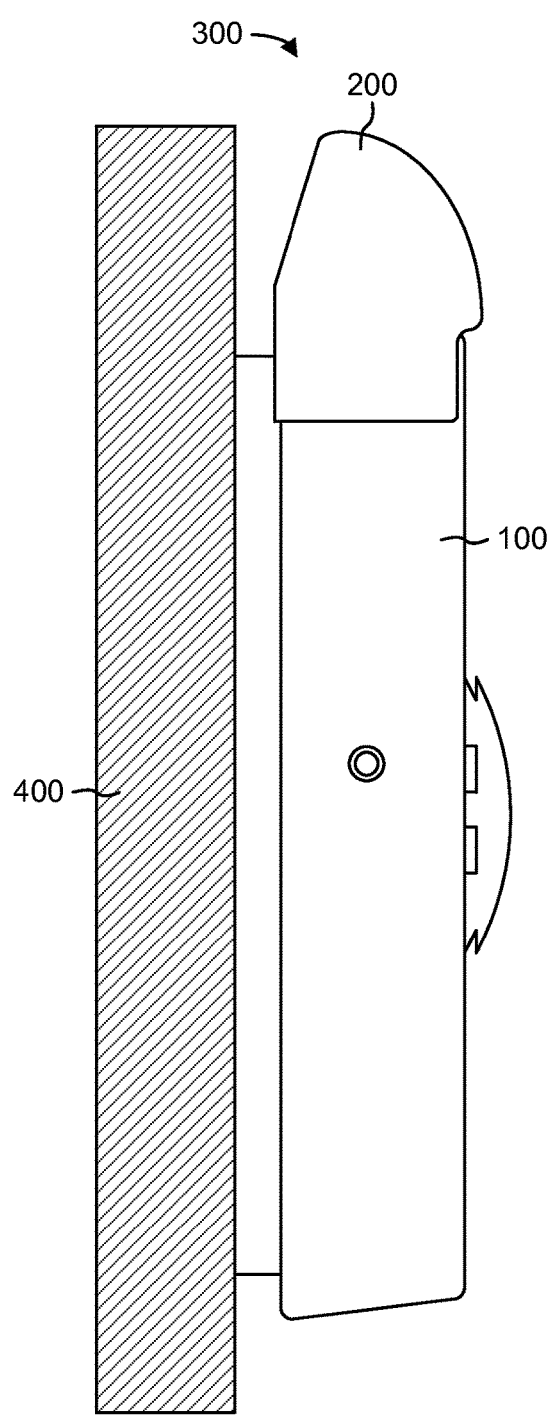
FIG. 7 is a side elevation view schematic drawing of the fluid protection cover of FIG. 3 installed on the electronic device of FIG. 1, according to an example embodiment.

Referring now to FIG. 7, a view of fluid protection cover assembly 300 is depicted in a schematic drawing, according to an example embodiment. Fluid protection cover assembly 300 includes electronic device 100 and fluid protection cover 200, and may be installed on wall 400 such that the rear face of electronic device enclosure 110 is flush with wall 400. As previously described, in some embodiments, fluid protection cover 200 may be a separate component from electronic device 100, permitting assembly 300 to be assembled and disassembled as desired. For example, in some embodiments, it may be necessary to periodically replace a battery in device 100, and thus necessary to remove cover 200 from device 100 in order to access a battery compartment. In other embodiments and as described above, certain features of fluid protection cover 200 may be incorporated into the design of electronic device enclosure 110 such that fluid protection cover assembly 300 is entirely embodied by electronic device 100.

Figure 8:
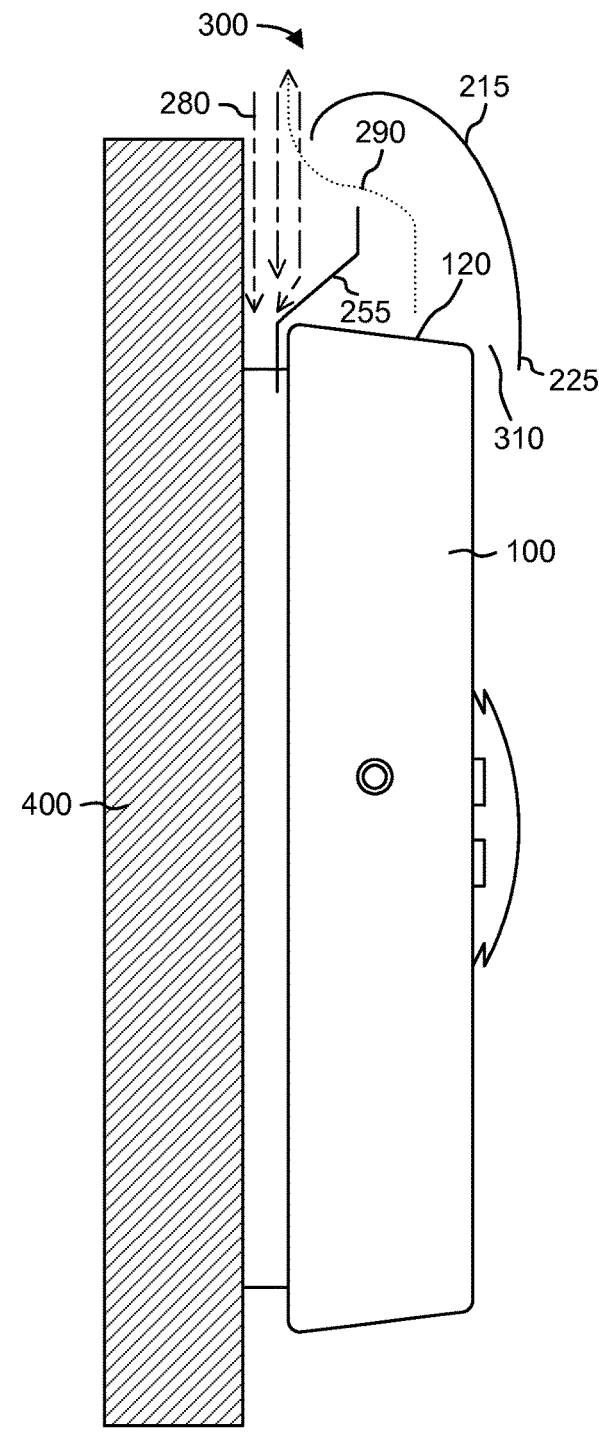
FIG. 8 is a side cross-sectional schematic drawing of the fluid protection cover of FIG. 3 installed on the electronic device of FIG. 1, according to an example embodiment.
Figure 9:
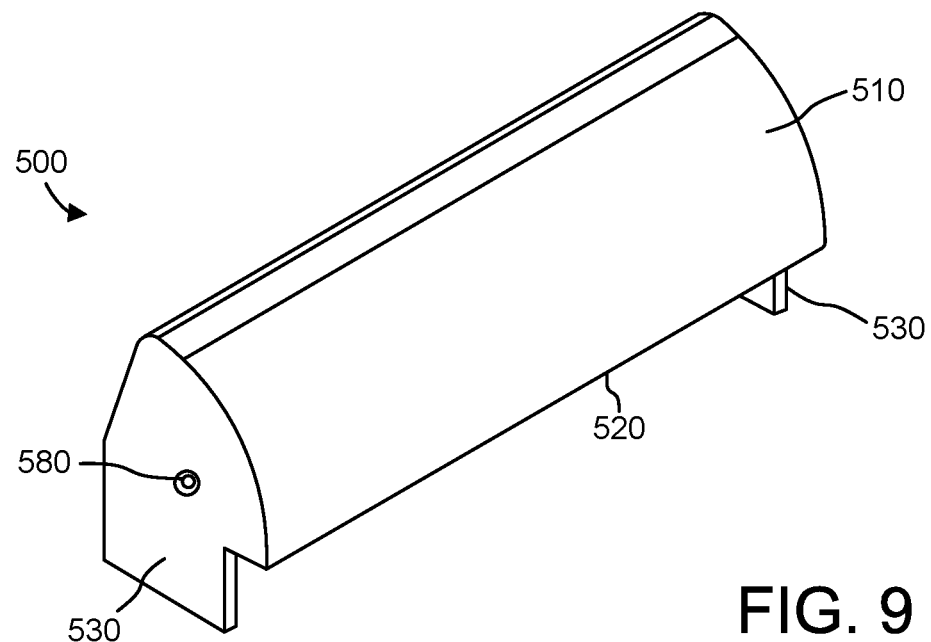
FIG. 9 is a perspective view schematic drawing of a fluid protection cover for an electronic device, according to another example embodiment.

Turning now to FIG. 8, another view of fluid protection cover assembly 300 is depicted in a schematic drawing with a simplified representation of certain features of fluid protection cover 200. The simplified features of cover 200 include cowl 215, bottom edge 225, and primary louver 255. The simplified features are depicted in a side cross-sectional view such that the exemplary paths of fluid 280 and convection air 290 may be better understood. As shown, bottom edge 225 of cowl 215 is not configured to be flush with electronic device 100. Instead, fluid protection cover 200 includes a gap 310 between bottom edge 225 and electronic device 100 such that any fluid that passes through the opening 260 (e.g., splatter) and then travels along inner surface of cowl 215 is not trapped between device 100 and cover 200, increasing the risk that fluid may build up and eventually flow into vent openings 120. Rather, gap 310 affords the fluid an unrestricted path to exit cover 200 harmlessly across the front face of electronic device enclosure 110.

Turning now to FIGS. 9-12, several views of another fluid protection cover 500 are depicted in schematic drawings, according to an example embodiment. Fluid protection cover 500 may include the same or substantially the same geometry as the geometry described above with reference to cover 200 (e.g., cowl 510, cowl bottom edge 520, end caps 530, cowl top edge 540, primary louver 550, opening 560, and resting points 570 are substantially similar to the corresponding features of cover 200). However, fluid protection cover is further shown to include additional features intended to aid in the retention of cover 500 on device 100, as well as the disassembly therefrom. These features include cover removal holes 580, recesses 585, and retention features 590.

Figure 11:
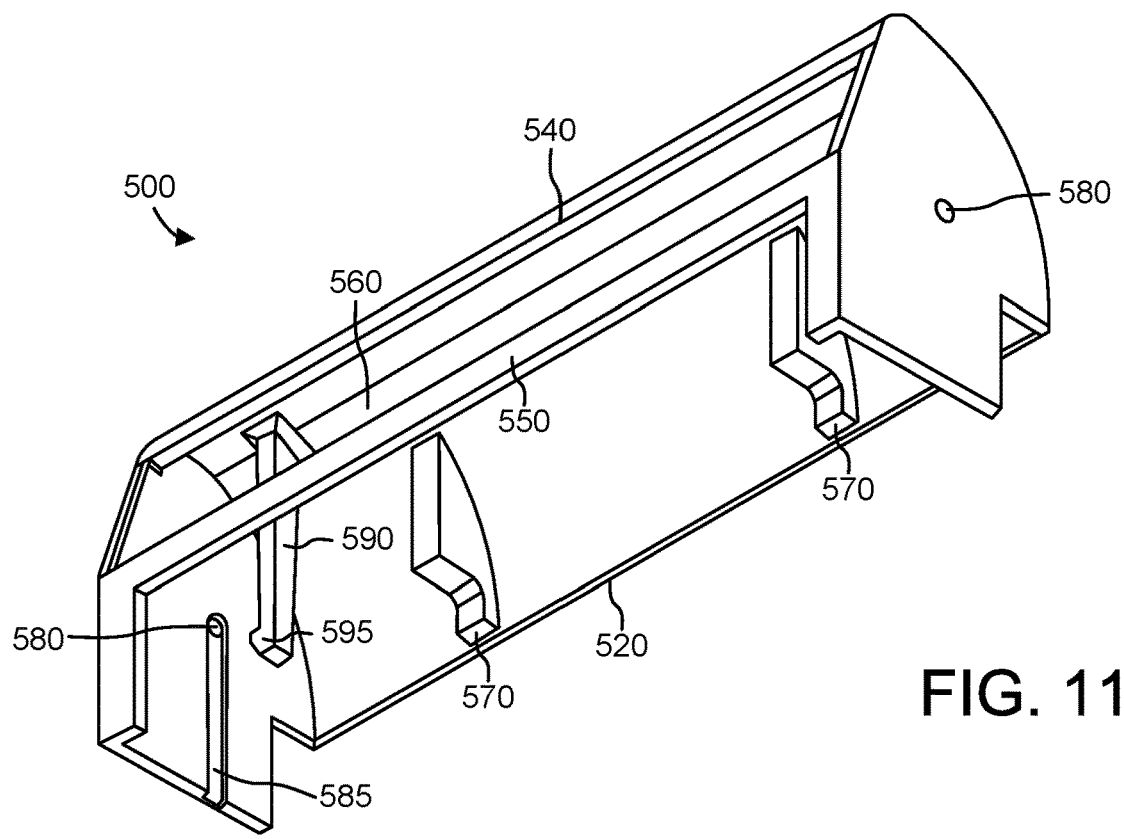
FIG. 11 is another perspective view schematic drawing of the fluid protection cover of FIG. 9, according to an example embodiment.

In some embodiments, retention features 590 are configured to prohibit disassembly of electronic device 100 and fluid protection cover 500 without the use of a removal tool. For example, these features may be configured to extend into vent holes 120 and snap onto an interior face or feature of electronic device enclosure 110. As depicted in FIG. 11, the retention features 590 of cover 500 may have a prong-like geometry, extending from the inner surface of cowl 510 and terminating at notched ends 595. When cover 500 is inserted over device 100, notched ends 595 may contact an inner surface of electronic device enclosure 110 and lock cover 500 into position relative device 100. Although cover 500 is depicted with snap fit retention features 590, in other embodiments, any type of suitable attachment mechanism may be utilized to retain cover 500 on device 100 (e.g., removable or non-removable adhesives, mechanical fasteners).

Retention features 590 may be further configured to exhibit some spring-like properties. For example, in order to disassemble cover 500 and device 100, a user may insert a tool (e.g., a screwdriver) or other device through a removal hole 580 to compress retention feature 590 such that notched end 595 breaks contact with the interior face or feature of device enclosure 110. Once contact retention feature 590 has been moved to an unlocked position, cover 500 may be removed from device 100. In some embodiments, cover 500 may further include recesses 585 terminating at removal holes 580 on the interior faces of end caps 530. In some embodiments, recesses 585 may provide an egress path for any fluid that enters cover 500 through hole 580.

Figure 10:
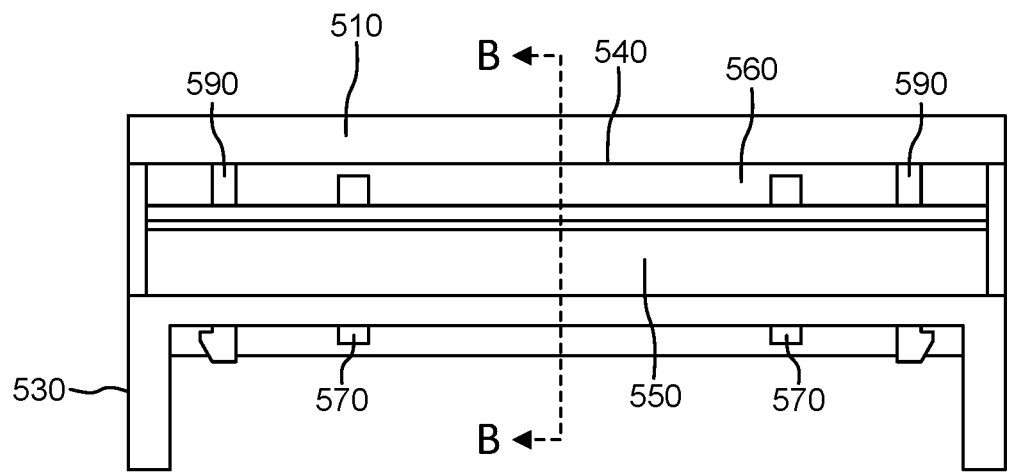
FIG. 10 is a rear elevation view schematic drawing of the fluid protection cover of FIG. 9, according to an example embodiment.
Figure 12:
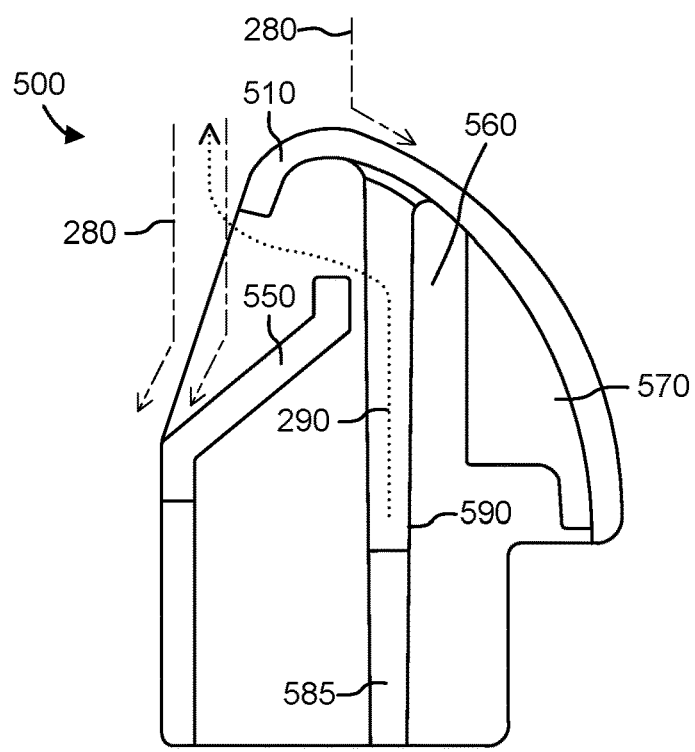
FIG. 12 is a cross-sectional view schematic drawing of the fluid protection cover of FIG. 9 taken along the line labeled "B-B" in FIG. 10, according to an example embodiment.

Referring now to FIG. 12, a side cross-sectional view schematic drawing of fluid protection cover 500 taken along the line labeled "B-B" in FIG. 10 is shown, according to an example embodiment. Similar to FIG. 6, FIG. 12 depicts exemplary paths of fluid 280 and convection air 290. As described above, fluid 280 is directed to flow down cowl 510 or primary louver 550 while convection air passes between cowl 510 and primary louver 550 to reach the ambient air. FIG. 12 additionally depicts an alternate geometry for resting points 570 than the geometry of resting points 270 depicted in FIGS. 5-6.

Figure 13:
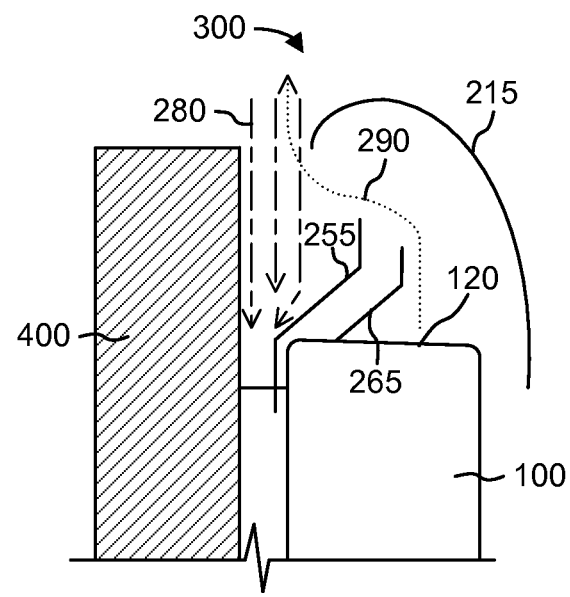
FIGS. 13-14 are additional side cross-sectional schematic drawings of the fluid protection cover of FIG. 3 installed on the electronic device of FIG. 1, according to example embodiments.
Figure 14:
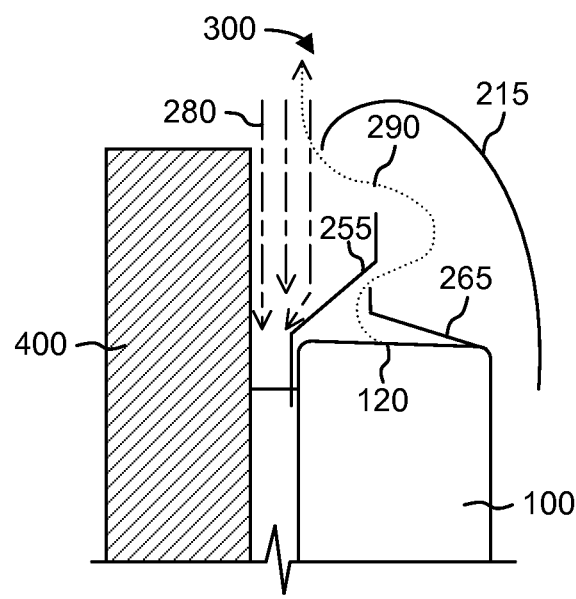

Referring now to FIGS. 13 and 14, additional side cross-sectional views of fluid protection cover 200 depicting secondary louvers 265 are shown, according to example embodiments. Secondary louvers 265 are located below primary louvers 255 and are configured to provide additional defense against fluid ingress by directing any fluid that enters cowl 215 away from vent openings 120. For example, as shown in FIG. 13, secondary louver 265 includes substantially the same geometry as primary louver 255, with the inclined face of secondary louver 265 directing fluid toward the back face of device enclosure 110 and the wall 400. As shown in FIG. 14, the inclined face of secondary louver 265 may instead be horizontally mirrored relative to primary louver 255, with the inclined face directing fluid toward the front face of electronic device enclosure 110. Although FIGS. 13 and 14 each depict cover 200 with a single secondary louver 265, cover 200 may contain any number of secondary louvers 265 required to provide adequate protection against fluid ingress. In addition, although FIGS. 13 and 14 depict secondary louvers 265 included with fluid protection cover 200, secondary louvers 265 may also be included with fluid protection cover 500.

Turning now to FIGS. 15-22, several views of another fluid protection housing 1500 are depicted in schematic drawings, according to an example embodiment. In some embodiments, fluid protection housing 1500 is similar to embodiments of the fluid protection covers described above in FIGS. 1-14, except as described below in FIGS. 15-22. In some embodiments, an electronic device 100 including fluid protection housing 1500 can be a wall-mounted sensor.

Figure 15:
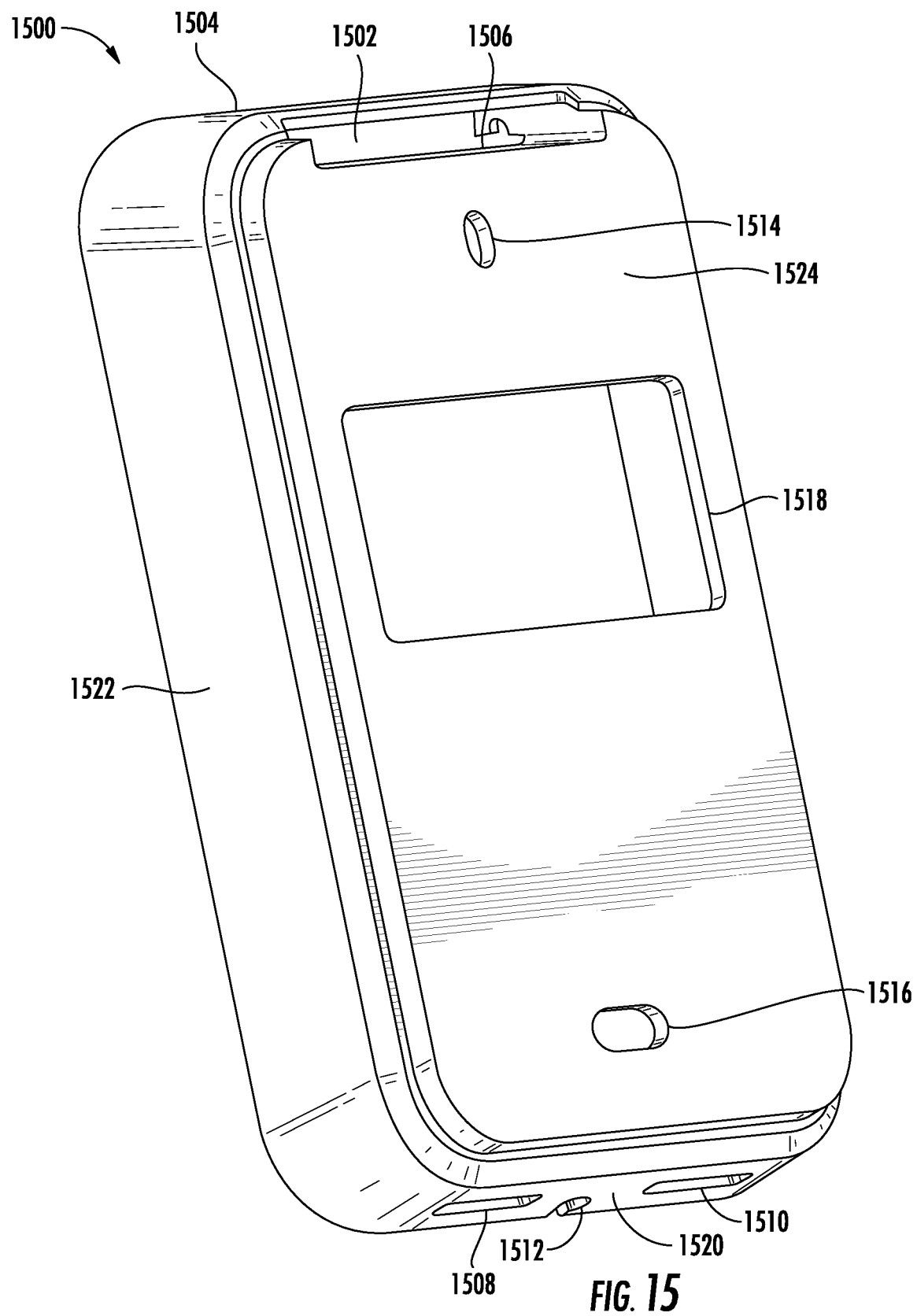
FIG. 15 is a perspective view of a fluid protection housing for an electronic device, according to an example embodiment.
Figure 16:
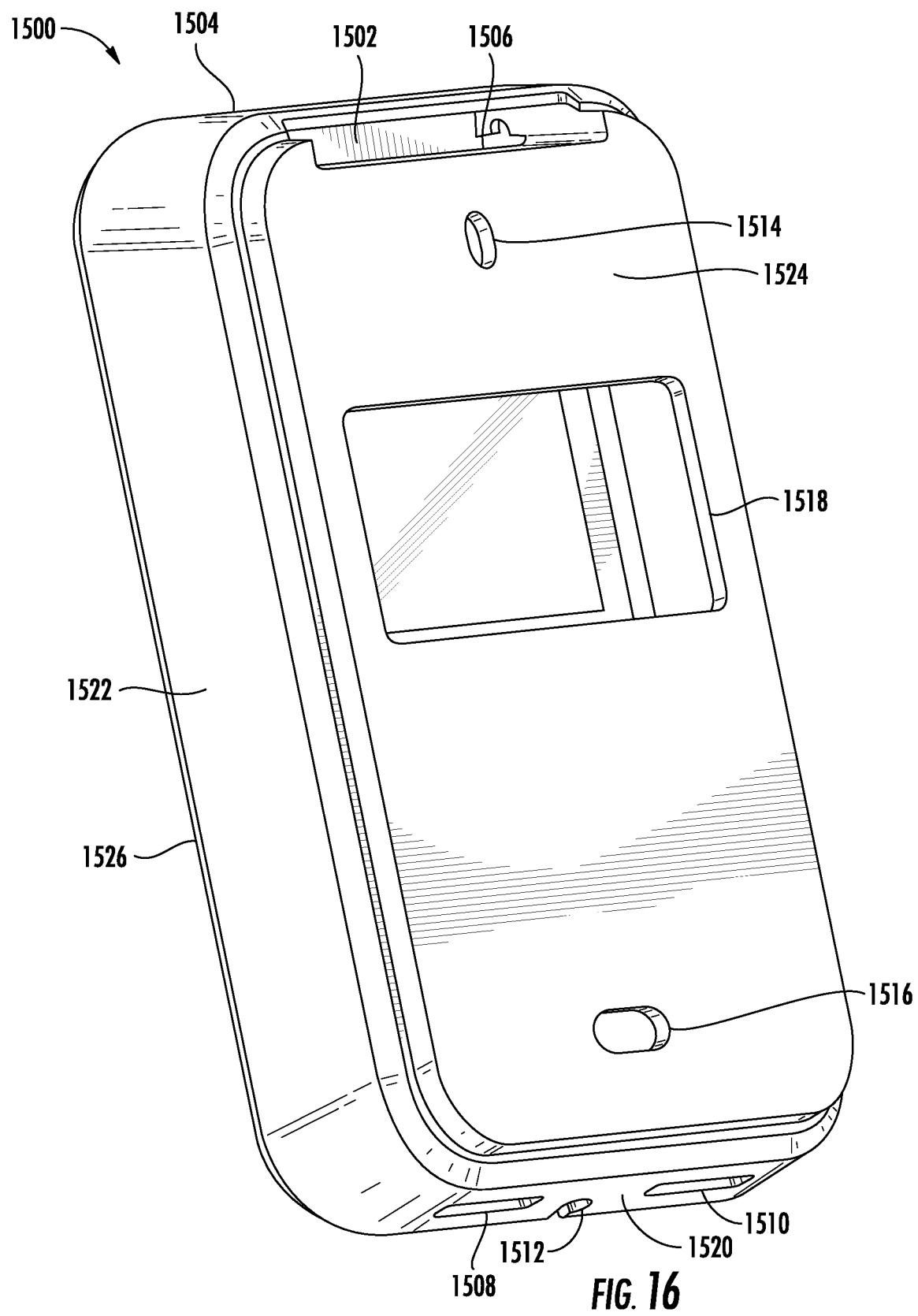
FIG. 16 is a perspective view of an electronic device including the fluid protection housing of FIG. 15.

Referring to FIGS. 15 and 16, perspective views of fluid protection housing 1500 are depicted according to an exemplary embodiment with FIG. 15 showing housing 1500 on its own and FIG. 16 showing housing 1500 as a component of electronic device 100. Fluid protection housing 1500 is adapted to perform the fluid protection functions of the fluid protection covers described in FIGS. 1-14. For example, fluid protection housing 1500 is adapted to both allow adequate ventilation of electronic device 100 via air outlet 1502 and air inlet 1508-1510 and also shield internal components of electronic device 100 that are susceptible to damage from fluid ingress. In the illustrated embodiment, fluid protection housing 1500 serves as the rear portion of the housing or enclosure of electronic device 100. For example, fluid protection housing 1500 can be mated with front housing or enclosure 1526 via a set of retention features to form a complete enclosure of electronic device 100. Front enclosure 1526 may include or support a display and/or user input devices (e.g. touch screen, switches, buttons, knobs, dials, etc.) that allow a user to interact with the electronic device 100. In this regard, a length and width of fluid protection housing 1500 may correspond with a length and width of front enclosure 1526 to facilitate attachment of fluid protection housing 1500 to front enclosure 1526. Fluid protection housing 1500 can also facilitate mounting of electronic device 100 to a vertical wall or surface with one or more mounting features 1514-1516.

Figure 17:
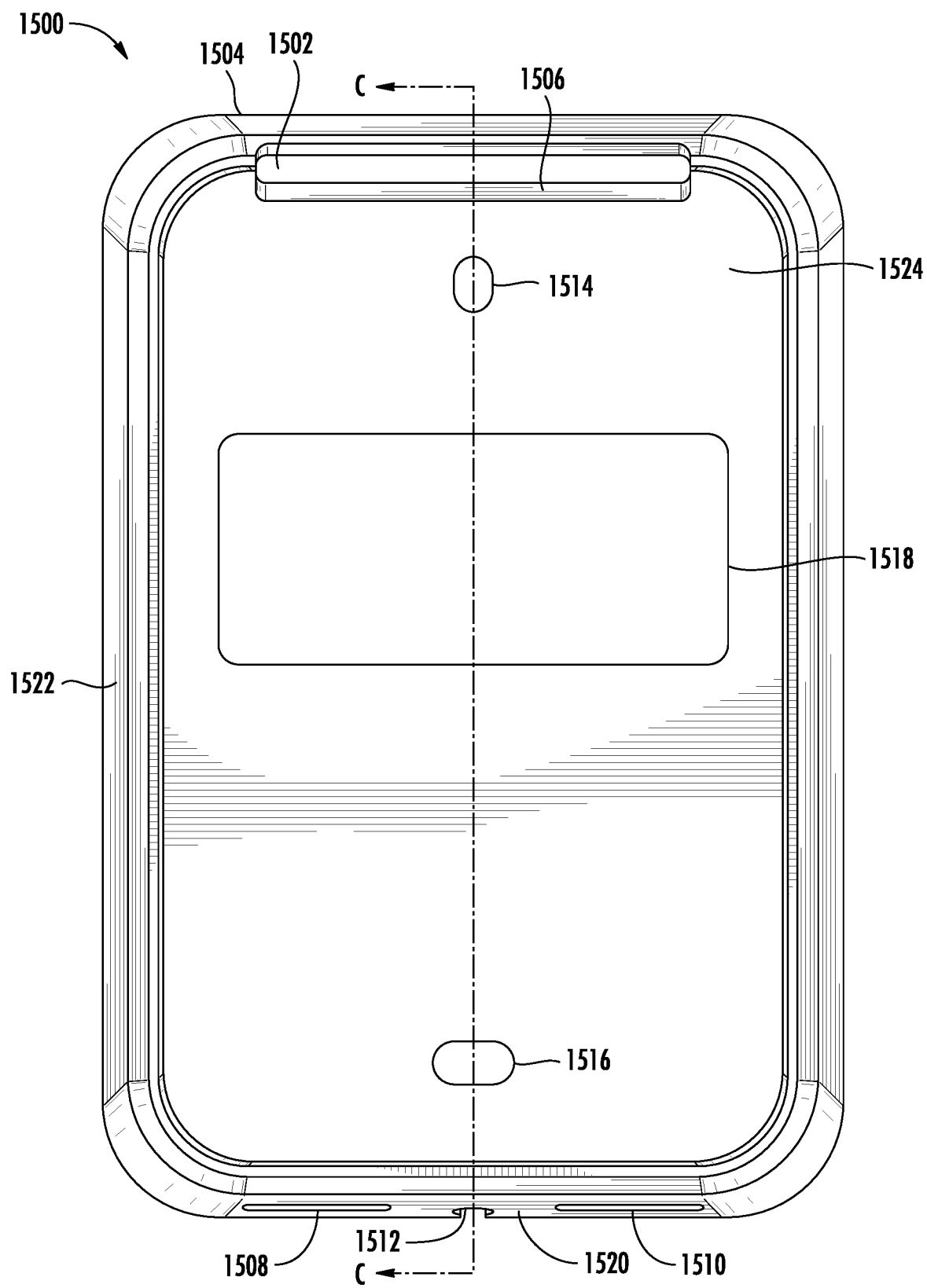
FIG. 17 is a rear elevation view of the fluid protection housing of FIG. 15.
Figure 18:
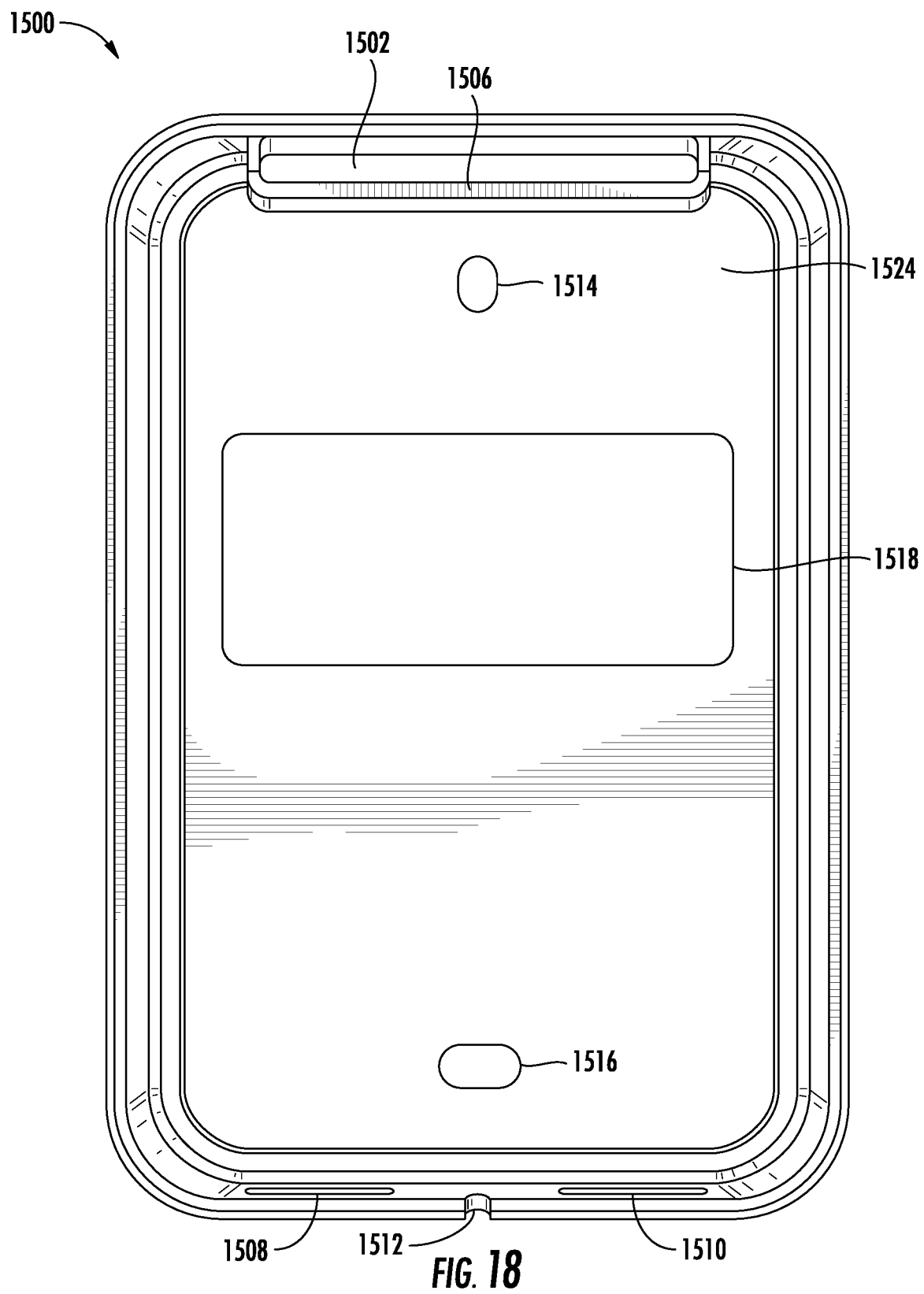
FIG. 18 is a front elevation view of the fluid protection housing of FIG. 15, with the front housing removed.
Figure 19:
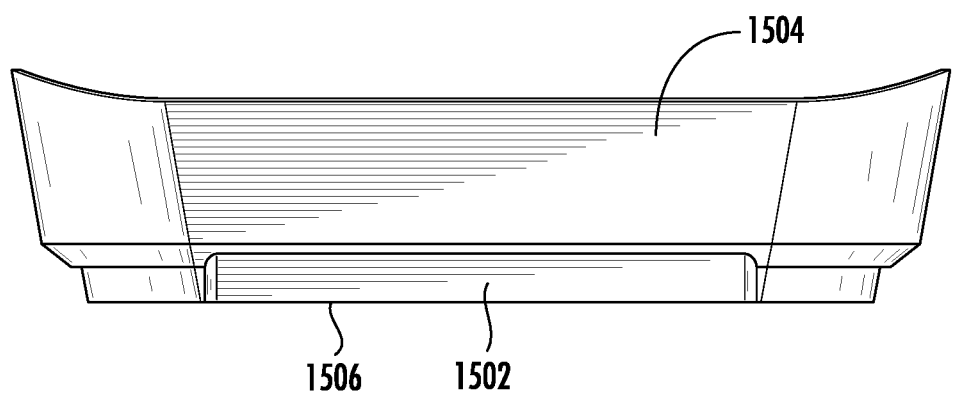
FIG. 19 is a top elevation view of the fluid protection housing of FIG. 15.

Referring to FIGS. 17-18, additional views of fluid protection housing 1500 are depicted, according to an exemplary embodiment. FIG. 17 depicts an elevation view of the rear of housing 1500. FIG. 18 depicts an elevation view of the front of housing 1500. Fluid protection housing 1500 includes rear wall 1524, a top wall 1504, side walls 1522, and a bottom wall 1520. Housing 1500 is open to the front to allow for attachment of front enclosure 1526.

Rear wall 1524 is shown to include mounting features 1514-1516. In some embodiments, any number of mounting features 1514-1516 can be provided to facilitate installation of electronic device 100 to a wall or vertical surface. Mounting features 1514-1516 can be configured to allow fluid protection housing 1500 with electronic device 100 to be installed to a surface such that rear wall 1524 is flush with the surface. For example, mounting features 1514-1516 can be oblong holes that receive screws to attach housing 1500 to a wall. In some embodiments, mounting features 1514-1516 can be configured to be any size shape or location within rear wall 1524 to facilitate installation. In some embodiments, fluid protection housing 1500 also includes opening 1512 in the bottom wall.

Rear wall 1524 of fluid protection housing 1500 is also shown to include a wiring opening 1518. Wiring opening 1518 allows one or more wires to pass into the interior of electronic device 100. In some embodiments, wiring opening 1518 has a length and width corresponding to a length and width of received wiring. For example, wiring opening 1518 may have a length and width that allow a wiring harness or other wiring configured to transmit power and/or control signals between electronic device 100 and external devices to access the interior of the electronic device 100. In other embodiments, wiring opening 1518 can be defined by any suitable length and width to facilitate installation and wiring connections.

In some embodiments, fluid protection housing 1500 includes additional features intended to aid in the retention of fluid protection housing 1500 to front enclosure 1526 and/or device 100, such as described above in FIGS. 9-12. In some embodiments, fluid protection housing 1500 includes additional features intended to reduce fluid ingress. For example, fluid protection housing 1500 can include a recess along an edge of interior surfaces of top wall 1504, side walls 1522, and bottom wall 1520. The recess can have one or more dimensions corresponding to one or more dimensions of front enclosure 1526 to form a tight-fitting seam when fluid protection housing 1500 is mated with front enclosure 1526. In this regard, when fluid protection housing 1500 is attached to front enclosure 1526 (e.g. with retention features), fluid ingress along the edge of interior surfaces of top wall 1504, side walls 1522, and bottom wall 1520 can be reduced. In some embodiments, a gasket is provided between housing 1500 and front enclosure 1526.

Figure 20:
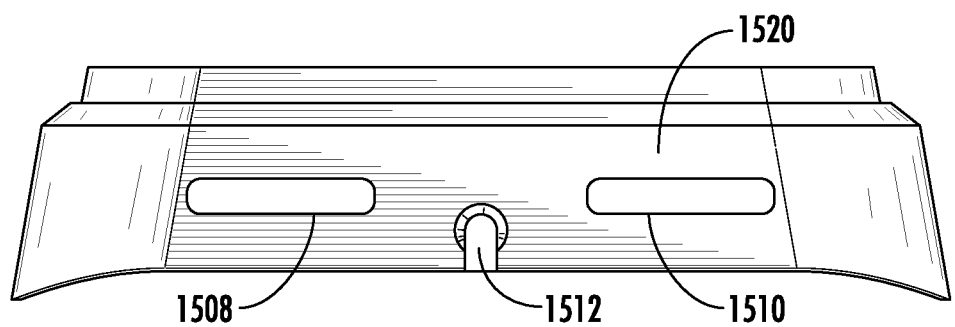
FIG. 20 is a bottom elevation view of the fluid protection housing of FIG. 15.

Referring to FIGS. 17-18, top wall 1504 includes an air outlet 1502. In the illustrated embodiment, outlet 1502 is formed as a single opening or aperture. In other embodiments, outlet 1502 is formed as multiple openings or apertures. Referring to FIG. 20 bottom wall 1520 is shown to include air inlets 1508-1510 formed as a pair of openings or apertures. In other embodiments, more or fewer openings or apertures are provided.

Air outlet 1502 and air inlet 1508-1510 permit the convection airflow necessary to adequately cool device 100. In other embodiments, device 100 may include a fan or blower to force cooling air through electronic device 100. Air outlet 1502 and air inlet 1508-1510 can also be configured at various locations of fluid protection housing 1500 to facilitate convection airflow. For example, fluid protection housing 1500 includes air outlet 1502 in or near top wall 1504 of fluid protection housing 1500 and air inlets 1508-1510 in or near bottom wall 1520. In this regard, fluid protection housing 1500 is configured to allow cool air to enter, through air inlet 1508-1510, an internal cavity of electronic device 100 defined by top wall 1504, bottom wall 1520, side walls 1522. The cool air can then absorb thermal energy generated by components of electronic device 100. Heated air can subsequently exit through air outlet 1502, thereby completing the ventilation process. Also, in some embodiments, electronic device 100 may be a thermostat or sensor including one or more sensors for sampling air quality (e.g., air quality sensors, volatile organic compound sensors, etc.) within a controlled space (e.g., the room the device 100 is located in). In these embodiments, the air flow path through the housing 1500 not only provides the described cooling function, but also provides the sensor with access to the air so that air quality may be sampled.

Figure 21:
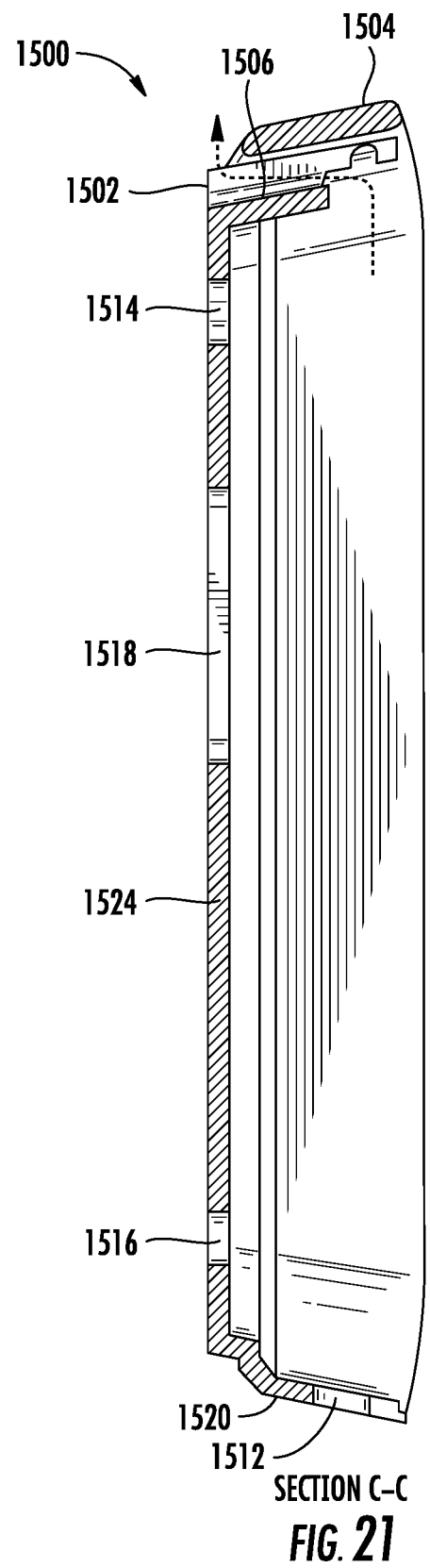
FIG. 21 is a cross-sectional view of the fluid protection housing of FIG. 15 taken along the line labeled "C-C" in FIG. 17.
Figure 22:
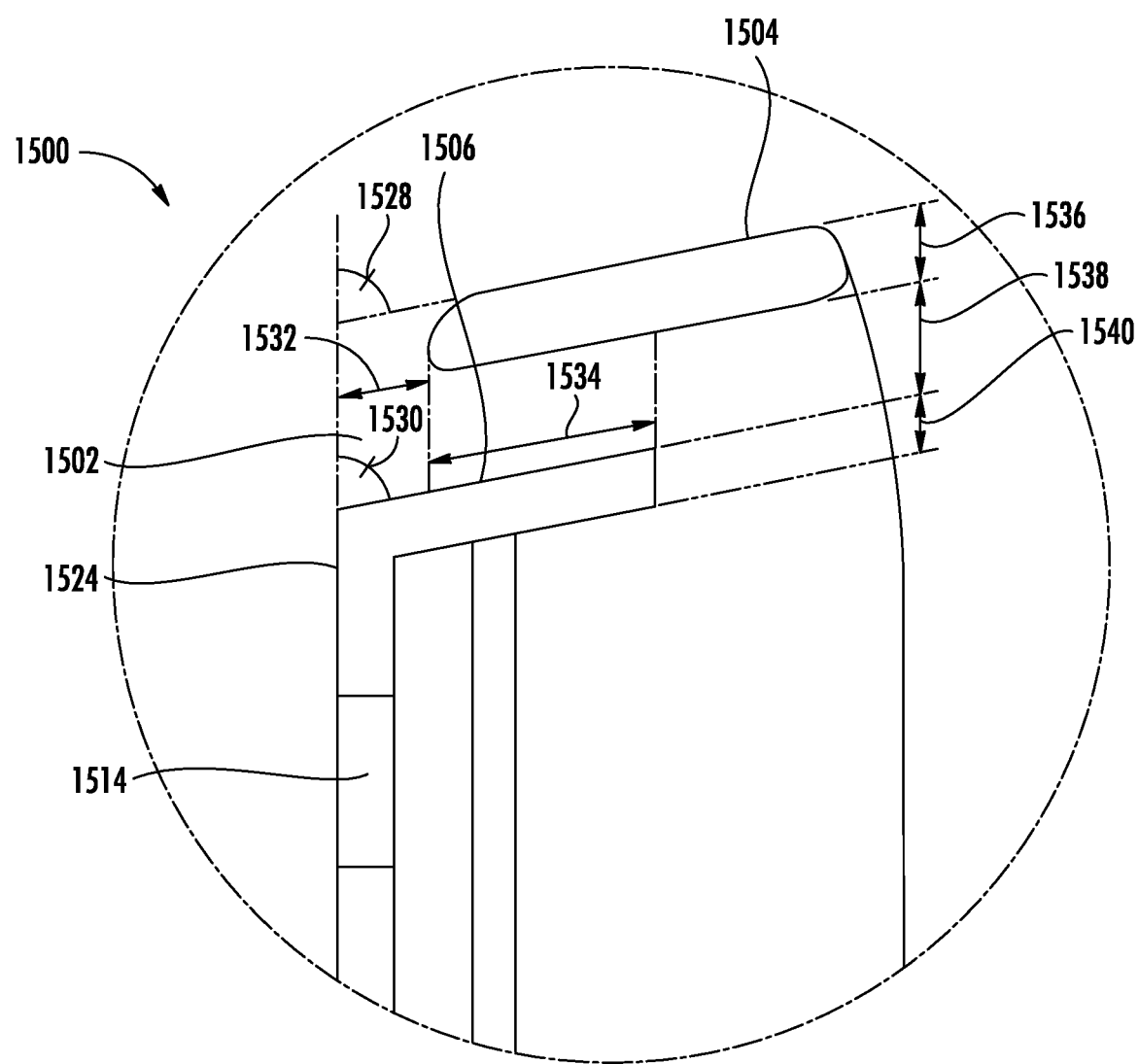
FIG. 22 is a detailed cross-sectional view of the fluid protection housing of FIG. 15 taken along the line labeled "C-C" in FIG. 17.

Referring to FIGS. 21-22, top wall 1504 and a ledge 1506 cooperate to define outlet 1502 with ledge 1506 positioned below top wall 1504. Outlet 1502 is adapted to restrict fluid ingress of device 100 while also providing ventilation of electronic device 100. For example, outlet 1502 has a vertical space 1538 defined by a substantially vertical distance between an interior surface of top wall 1504 and an exterior surface of ledge 1506. Vertical space 1538 can be configured to have any suitable vertical distance that facilitates the convection airflow path necessary to adequately cool device 100.

Fluid protection housing 1500 is also adapted to restrict fluid ingress via an overlap area 1534, a projection area 1532, and exterior angles 1528-1530. Overlap area 1534 is defined by a portion of the top wall 1504 overlapping a portion of the ledge 1506 that extends for a substantially horizontal distance as shown in FIG. 22. In this regard, fluid that falls or splashes on ledge 1506 cannot enter an internal cavity of electronic device 100 by top wall 1504, side walls 1522, bottom wall 1520, and rear wall 1524 without first travelling past overlap area 1534. Accordingly, overlap area 1534 can be adapted to create a suitable distance such that fluid will be unlikely to enter the internal cavity of electronic device 100. Arranging vertical space 1538 and overlap area 1534 as shown with overlap area 1534 having a greater horizontal depth than the vertical height of vertical space 1538 is believed to reduce the likelihood of fluid entering the electronic device 100 because outlet 1502 has a relatively narrow vertical opening and a relatively long horizontal depth, which reduces the surface area available for fluid to enter outlet 1502 and increases the distance any fluid entering outlet 1502 must travel to reach the interior cavity of electronic device 100.

Projection area 1532 and exterior angles 1528-1530 are configured to advantageously define a flow path intended to restrict ingress of fluid contacting exterior surfaces of housing 1500 by directing fluid away from the internal cavity of device 100. Top wall 1504 is positioned at angle 1528 relative to rear wall 1524. Ledge 1506 is positioned at angle 1530 relative to rear wall 1524. Angle 1528 and angle 1530 are exterior angles less than 90° relative to rear wall 1524 to direct fluid on top wall 1504 and ledge 1506 away from the interior cavity of the electronic device 100 due to gravity. Outlet 1502 has a projection area 1532 defined by a substantially horizontal distance along ledge 1506 between the edge of top wall 1504 the exterior surface of rear wall 1524. In this regard, top wall 1504, ledge 1506, and projection area 1532 collectively define an advantageous flow path such that fluid that falls on top wall 1504 will naturally flow down to projection area 1532 and fluid that falls onto projection area 1532 will naturally flow down along exterior surface of rear wall 1524. As a result, fluid that falls on either top wall 1504 or ledge 1506 will unlikely enter outlet 1502 and reach the internal cavity of electronic device 100. In some embodiments, top wall 1504 is flat (i.e., angle 1528 is 90°) and angled ledge 1506 is relied upon to direct fluid away from interior cavity of electronic device 100.

In various embodiments, one or more features described above can be configured to facilitate ventilation of airflow through outlet 1502 and/or restrict fluid ingress through outlet 1502. For example, in some embodiments, electronic device 100 may contain components that generate excessive heat such that additional ventilation of electronic device 100 is desirable. In this regard, vertical space 1538 of outlet 1502 and/or projection area 1532 can be lengthened to permit the necessary ventilation required to cool electronic device 100. Furthermore, in some embodiments, electronic device 100 may require additional protection against fluid ingress, for example due to unique environmental conditions of a specific installation location and/or due to an increased vertical space 1538 of outlet 1502. In this regard, a horizontal distance of overlap area 1534 can be increased such that fluid ingress is adequately restricted. In some embodiments, overlap area 1534 has a horizontal distance of at least six millimeters, vertical space 1538 has vertical distance of at least five millimeters, and projection area 1532 has a horizontal distance of at least four millimeters. Embodiments may use any suitable value of overlap area 1534, vertical space 1538, and projection area 1532. Additionally or alternatively, a value of exterior angle 1528 and/or a value of exterior angle 1530 relative to rear wall 1524 can be decreased such that fluid ingress is further restricted.

In some embodiments, one or more features described above can be configured to facilitate the structural integrity of fluid protection housing 1500 or portions therein. For example, top wall 1504 can be configured to have a minimum thickness 1536 that may depend on various environmental conditions of a specific installation location. For example, top wall 1504 may have a greater minimum thickness 1536 when electronic device with fluid protection housing 1500 is installed in an outdoor location or a location susceptible to increased physical contact. Similarly, in some embodiments, ledge 1506 has a minimum thickness 1540 that may vary to facilitate the structural integrity of fluid protection housing 1500 or portions therein.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

What is claimed is:

1. A housing for an electronic device, comprising:
    a rear wall with an exterior surface;
    a top wall;
    a ledge positioned below the top wall, the ledge including an exterior surface, wherein a portion of the top wall overlaps a portion of the ledge and defines an overlap area; and
    an air outlet formed between the top wall and the ledge;
    wherein the exterior surface of the ledge is positioned at an exterior angle less than 90° relative to the exterior surface of the rear wall.

2. The housing of claim 1, wherein the top wall includes an exterior surface positioned at an exterior angle less than 90° relative to the exterior surface of the rear wall.

3. The housing of claim 2, wherein the ledge includes a projection area defined by a horizontal distance between an edge of the top wall and the exterior surface of the rear wall.

4. The housing of claim 3, wherein the horizontal distance of the projection area is at least four millimeters.

5. The housing of claim 1, wherein the horizontal distance of the overlap area is at least six millimeters.

6. The housing of claim 1, wherein a vertical distance between an interior surface of the top wall and the exterior surface of the ledge is less than the horizontal distance of the overlap area.

7. The housing of claim 2, further comprising a bottom wall that includes an air inlet.

8. The housing of claim 2, wherein the rear wall includes a wiring opening configured to receive one or more wires.

9. The housing of claim 2, wherein the rear wall includes a plurality of mounting features configured to permit attachment of the housing to a surface.

10. An electronic device, comprising:
    a housing that includes:
        a rear wall with an exterior surface;
        a top wall having an exterior surface positioned at an exterior angle less than 90 degrees relative to the exterior surface of the rear wall;
        a ledge positioned below the top wall, the ledge including an exterior surface; and
        an air outlet formed between the top wall and the ledge;
        wherein the exterior surface of the ledge is positioned at an exterior angle less than 90° relative to the exterior surface of the rear wall; and
    a front enclosure attached to the housing.

11. The electronic device of claim 10, wherein the ledge includes a projection area defined by a horizontal distance between an edge of the top wall and the exterior surface of the rear wall.

12. The electronic device of claim 11, wherein the horizontal distance of the projection area is at least four millimeters.

13. The electronic device of claim 10, wherein a portion of the top wall overlaps a portion of the ledge and defines an overlap area.

14. The electronic device of claim 13, wherein the horizontal distance of the overlap area is at least six millimeters.

15. The electronic device of claim 13, wherein the vertical distance between an interior surface of the top wall and the exterior surface of the ledge is less than the horizontal distance of the overlap area.

16. The electronic device of claim 10, further comprising a bottom wall that includes an air inlet.

17. The electronic device of claim 10, wherein the rear wall includes a wiring opening configured to receive one or more wires.

18. The electronic device of claim 10, wherein the rear wall includes a plurality of mounting features configured to permit attachment of the electronic device to a surface.

19. A housing for an electronic device, comprising:
    a rear wall with an exterior surface;
    a top wall;
    a ledge positioned below the top wall, the ledge including an exterior surface; and
    an air outlet formed between the top wall and the ledge;
    wherein the exterior surface of the ledge is positioned at an exterior angle less than 90° relative to the exterior surface of the rear wall and is configured to direct water away from the air outlet.

* * * * *